US009679658B2

(12) United States Patent
Pelster et al.

(10) Patent No.: US 9,679,658 B2
(45) Date of Patent: Jun. 13, 2017

(54) METHOD AND APPARATUS FOR REDUCING READ LATENCY FOR A BLOCK ERASABLE NON-VOLATILE MEMORY

(71) Applicant: INTEL CORPORATION, Santa Clara, CA (US)

(72) Inventors: David J. Pelster, Longmont, CO (US); Yogesh B. Wakchaure, Folsom, CA (US); Xin Guo, San Jose, CA (US); Paul D. Ruby, Folsom, CA (US); Justin R. Dayacap, Folsom, CA (US); Joseph F. Doller, El Dorado Hills, CA (US); Robert E. Frickey, Sacramento, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 14/752,817

(22) Filed: Jun. 26, 2015

(65) Prior Publication Data
US 2016/0379715 A1   Dec. 29, 2016

(51) Int. Cl.
G11C 11/34   (2006.01)
G11C 16/16   (2006.01)
G11C 16/26   (2006.01)
G11C 16/34   (2006.01)

(52) U.S. Cl.
CPC ............ G11C 16/16 (2013.01); G11C 16/26 (2013.01); G11C 16/3445 (2013.01)

(58) Field of Classification Search
USPC ............ 365/185.11, 185.12, 185.17, 185.18, 365/185.19, 185.22, 185.29, 185.33
See application file for complete search history.

(56) References Cited

U.S. PATENT DOCUMENTS

| | | | | |
|---|---|---|---|---|
| 5,509,134 A | * | 4/1996 | Fandrich | G06F 9/45512 365/185.33 |
| 5,912,845 A | * | 6/1999 | Chen | G11C 16/107 365/185.18 |
| 5,956,273 A | * | 9/1999 | Lin | G11C 16/10 365/185.22 |
| 5,963,477 A | * | 10/1999 | Hung | G11C 16/16 365/185.11 |
| 6,166,956 A | * | 12/2000 | Yiu | G11C 16/10 365/185.19 |

(Continued)

OTHER PUBLICATIONS

Choudhuri, S. et al., "Deterministic Service Guarantees for NAND Flash Using Partial Block Cleaning", In the Proceedings of the 6th IEEE/ACM.IFIP International Conference on Hardware/Software Codesign and System Synthesis, Oct. 2008, 6 pp.

(Continued)

Primary Examiner — Trong Phan
(74) Attorney, Agent, or Firm — Konrad Raynes Davda & Victor LLP; David W. Victor

(57) ABSTRACT

Provided are an apparatus, memory controller and method for performing a block erase operation with respect to a non-volatile memory. A command is generated to perform a portion of the block erase operation. At least one read or write operation is performed after executing the command. An additional instance of the command is executed in response to determining that the block erase operation did not complete after performing the at least one read or write operation.

20 Claims, 7 Drawing Sheets

(56) References Cited

U.S. PATENT DOCUMENTS

| | | | | |
|---|---|---|---|---|
| 6,496,417 | B1* | 12/2002 | Shiau | G11C 16/107 |
| | | | | 365/185.18 |
| 6,603,682 | B2* | 8/2003 | Keays | G11C 16/14 |
| | | | | 365/185.11 |
| 8,300,477 | B2* | 10/2012 | Haukness | G11C 16/16 |
| | | | | 365/185.29 |
| 2005/0013154 | A1 | 1/2005 | Honda et al. | |
| 2005/0219909 | A1 | 10/2005 | Futatsuyama et al. | |
| 2009/0122607 | A1 | 5/2009 | Aritome | |
| 2014/0010015 | A1 | 1/2014 | Nakai et al. | |
| 2014/0269069 | A1 | 9/2014 | D'Abreu et al. | |

OTHER PUBLICATIONS

Crippa, L., et al., "Nonvolatile Memories: NOR vs. NAND Architectures", Memories in Wireless Systems, Chapter 2, © Springer-Verlag Berlin Heidelberg 2008, 26 pp.

Intel Corporation, "Micron and Intel Unveil New 3D NAND Flash Memory", [online], Mar. 26, 2015, [Retrieved on Jun. 17, 2015], retrieved from the Internet at <URL: http://newsroom.intel.com/community/intel_newsroom/blog/2015/03/26/m...>, 3 pp.

Wikipedia, "Flash Memory", [online], Last modified on Jun. 17, 2015, [Retrieved on Jun. 17, 2015], Retrieved from the Internet at <URL: https://en.wikipedia.org/w/index.php?title=Flash_memory&oldid=667336189>, 19 pp.

Wu, G. et al., "Reducing SSD Read Latency via NAND Flash Program and Erase Suspension", Proceedings of the 10th USENIX Conference on File and Storage Technologies, Feb. 2012, 7 pp.

International Search Report, Aug. 29, 2016, for International Application No. PCT/US2016/034474, Total 3 pp.

International Search Report & Written Opinion, Aug. 29, 2016, for International Application No. PCT/US2016/034474, Total 2 pp.

Written Opinion, Aug. 29, 2016, for International Application No. PCT/US2016/034474, Total 9 pp.

\* cited by examiner

Erase Registers

METHOD AND APPARATUS FOR REDUCING READ LATENCY FOR A BLOCK ERASABLE NON-VOLATILE MEMORY

TECHNICAL FIELD

Embodiments described herein generally relate to method and apparatus for reducing read latency for a block erasable non-volatile memory.

BACKGROUND

An important advantage of solid state drives (SSD) is their low maximum latencies in processing read and write operations over the performance of magnetic hard disk drives. However, SSDs may implement background operations that improve data integrity which trigger write and erase operations to non-volatile memory in the SSD. These background erase and write operations can increase latency, especially in read centric workloads.

Specifically, the host can experience latencies exposed from both write and erase operations to block erasable non-volatile memory, for example NAND, during read only workloads. Maximum NAND component write and erase latencies are more than an order of magnitude greater than maximum read latencies, and erase latencies are several times larger than write latencies. Thus, a read command following an erase command in the command queue in the SSD could experience a considerable increase in latency waiting for the erase operation to complete. Furthermore, the delta between maximum read and erase latencies continues to increase through NAND component generations. For instance, in a simple system where NAND commands are queued in order, if a host read targets a NAND component where a block erase operation has already started, the host will experience a read command latency that is equal to the latencies of a NAND read command plus a NAND erase command. For example, it is possible to have a maximum read latency on the order of 100 micro seconds (µs) and erase latency on the order of 10 milliseconds (ms). For a host that is sending only read commands-ignoring other latencies in the system, the host could see a worst case read command latency of 10.1 ms.

There is a need in the art for improved techniques for reducing the latency for read and write operations caused by erase operations.

BRIEF DESCRIPTION OF THE DRAWINGS

Embodiments are described by way of example, with reference to the accompanying drawings, which are not drawn to scale, in which like reference numerals refer to similar elements.

DESCRIPTION OF EMBODIMENTS

Figure 1:
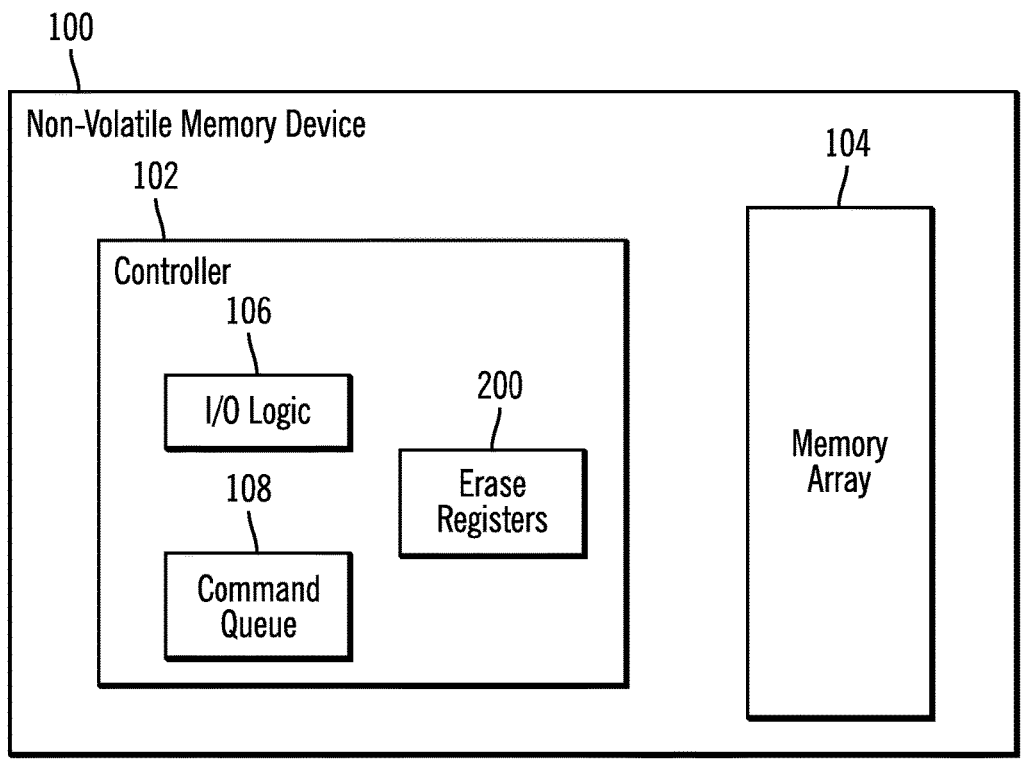
FIG. 1 illustrates an embodiment of a non-volatile memory device.

One prior art technique to reduce read and write latency from erase operations is to implement erase suspend and resume commands. If a host requests a read command after the internal erase command has been dispatched to the NAND component by the SSD controller, the SSD controller may send an erase suspend command to pause the erase to allow a host read to progress without waiting for the erase command to complete. After a host read command is received after the erase command is added to the command queue, an erase suspend command is injected into the controller command queue before the read to suspend the erase to allow the read command to proceed. After the read command completes, an erase resume command is injected into the command queue to cause the erase operation to continue. In an alternative implementation, the SSD controller may have a timer interface to inject the erase suspend commands after reaching a timeout to force the erase to suspend to allow a read to proceed so as to avoid a read operation experiencing the full latency of the erase operation. The SSD controller and NAND components, e.g., NAND dies, would require extra registers to track the progress of an erase that is suspended.

Described embodiments provide a solution that does not require an intrusive abort (suspend) interface within the SSD controller and NAND components by interjecting partial erase commands, referred to as a piece-wise erase command, erase commands, or simply commands, that each perform only a portion of the block erase operation. For instance, the block erase operation may require multiple pulse and verify operations to apply a voltage across a block of cells to reset the cell values to an erased state. A piece-wise erase command may comprise a single erase command or pulse and verify operation. In this way, a piece-wise erase command is interleaved with multiple read and write commands to limit the increased latency due to the erase operation to that of the partial erase operation, i.e., piece-wise erase command.

The described interleaving process with piece-wise erase commands (also referred to as the commands) is also advantageous because it allows control of the duration and speed of the erase operations that does not require out of order suspend and resume command executions.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

FIG. 1 illustrates an embodiment of a non-volatile memory device 100 having a controller 102 and a memory array 104 of non-volatile memory cells. The non-volatile memory device 100 may function as both a memory device and/or a storage device in a computing system, and may be used to perform the role of volatile memory devices and disk drives in a computing system. In an embodiment, the non-volatile memory device 100 may comprise a solid state drive (SSD). The controller 102 includes Input/Output (I/O) logic 106 to manage read and write requests directed to the memory array 104 as well as logic to handle erase operations with respect to a block of pages of cells in the memory array 104. The I/O logic 106 adds read/write and erase commands to a command queue 108, from which the commands are accessed and executed. The I/O logic 106 maintains erase registers 200 to manage erase operations. The controller 102 includes various other logic to perform additional memory management operations.

The memory storage array 104 may comprise electrically erasable and non-volatile memory cells, such as flash storage devices. For instance, the memory storage array 104 may comprise NAND dies of memory cells, also known as NAND chips or packages. In one embodiment, the NAND dies may comprise a multilevel cell (MLC) NAND flash memory that in each cell records two bit values, a lower bit value and an upper bit value. Alternatively, the NAND dies may comprise single level cell (SLC) and triple level cell (TLC) NAND memories. Yet further, the NAND dies may comprise 3D NAND flash memory using floating gate cells. The storage array 104 may also comprise, but is not limited to, MLC NAND flash memory, ferroelectric random-access memory (FeTRAM), nanowire-based non-volatile memory, three-dimensional (3D) crosspoint memory such as phase change memory (PCM), memory that incorporates memristor technology, Magnetoresistive random-access memory (MRAM), Spin Transfer Torque (STT)-MRAM, a single level cell (SLC) Flash memory and other electrically erasable programmable read only memory (EEPROM) type devices.

Figure 2:
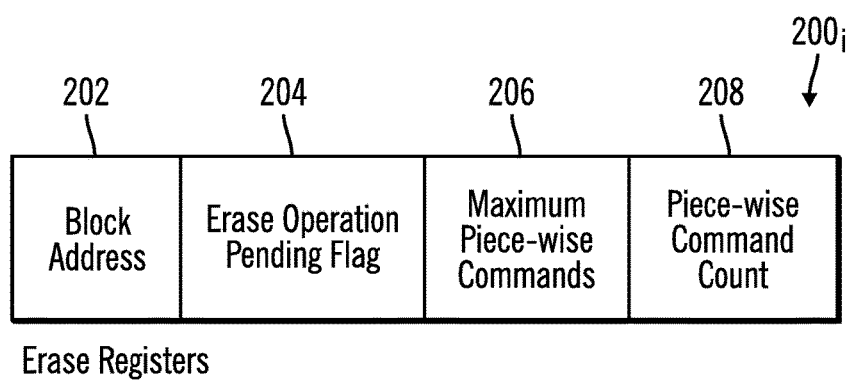
FIG. 2 illustrates an embodiment of erase registers.

FIG. 2 illustrates an embodiment of an instance of erase registers $200_i$ for a block address being subject to the block erase operation to free space for write operations being performed. In one embodiment the instance of erase registers $200_i$ may include a block address 202 identifying the block of pages of memory cells; an erase operation pending flag 204 indicating whether an erase operation is ongoing with respect to the block address 202; a maximum number of piecewise commands 206 to be performed to implement a block erase operation/command; and a piecewise command count 208 indicating a number of piecewise erase commands that have been executed as part of performing the pending block erase operation.

Figure 3:
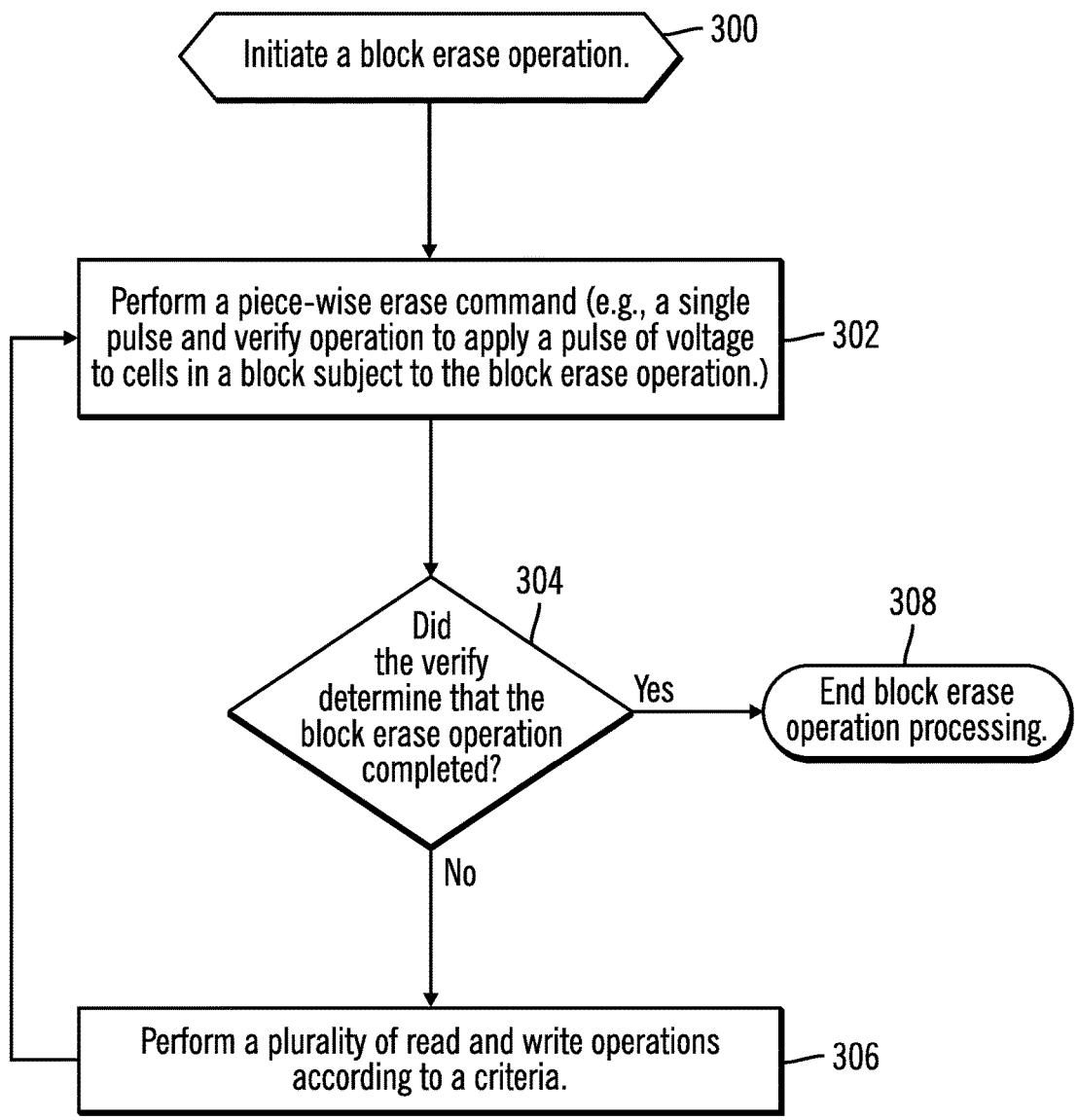
FIG. 3 illustrates an embodiment of operations to interleave erase piece-wise commands with read and write commands.

FIG. 3 illustrates an embodiment of operations performed by the I/O logic 106 to interleave piece-wise erase commands with read and write operations. Upon initiating (at block 300) a block erase operation to erase a block of cells, e.g., NAND cells, the I/O logic 106 performs (at block 302) a piece-wise erase command to the block of cells being subject to an erase operation. In certain embodiments, the piece-wise erase command may comprise a portion of a block erase operation, such as a single pulse and verify operation to apply a voltage across the block of cells to erase. If (at block 304) the verify aspect of the command did not verify that the block erase operation completed and changed all the cells in the block to an erased state, e.g., all logical "ones", then the I/O logic 106 performs (at block 306) a plurality of read and write operations. After performing the plurality of read and write operations according to a criteria, control returns to block 302 to interleave another piece-wise erase command into the operations. If (at block 304) the verify returned that the erase operation completed, then the erase operation processing is terminated (at block 308), such that piece-wise erase commands are no longer interleaved.

With the described embodiments, piece-wise erase commands, such as to perform a single pulse and verify operation, are interleaved with read and write commands. In certain embodiments, the interleaving may involve performing a piece-wise erase command after performing a predetermined number of write operations. For instance, the write operations may be performed with respect to a page of a block, different from the block subject to the erase operation. In one embodiment, the number of write operations may be used to control the piece-wise erase interleave rate so that by the time an entire block of pages would be written, the erase operation completes. This ensures a block of pages is freed by the time write operations use a block of pages. Further, read operations may not affect the timing of issuing the piecewise erase command, so that the piece-wise erase commands are only triggered after performing a number of write operations, but an unlimited number of read operations may be performed. In this way, the piece-wise erase commands are issued at a rate that matches the bandwidth requirements of writes in the system, so that a block is erased by the time an entire block is written, so that a block of free space is available to perform the write operation in NAND implementations.

In certain embodiments, a piece-wise erase command (or command) comprises a single pulse and verify operation to apply a voltage across the cells of the block to change their state to an erase state, e.g., the writing of all logical "ones" to the cells in the block. In an alternative embodiment, a single piece-wise erase command may cause multiple pulse and verify operations, but less than a total number of pulse and verify operations that would be performed to complete an entire erase operation.

In certain embodiments, only read and write operations to blocks of cells different from the block of cells subject to the erase operation are permitted while the piece-wise erase commands are ongoing.

Figure 4:
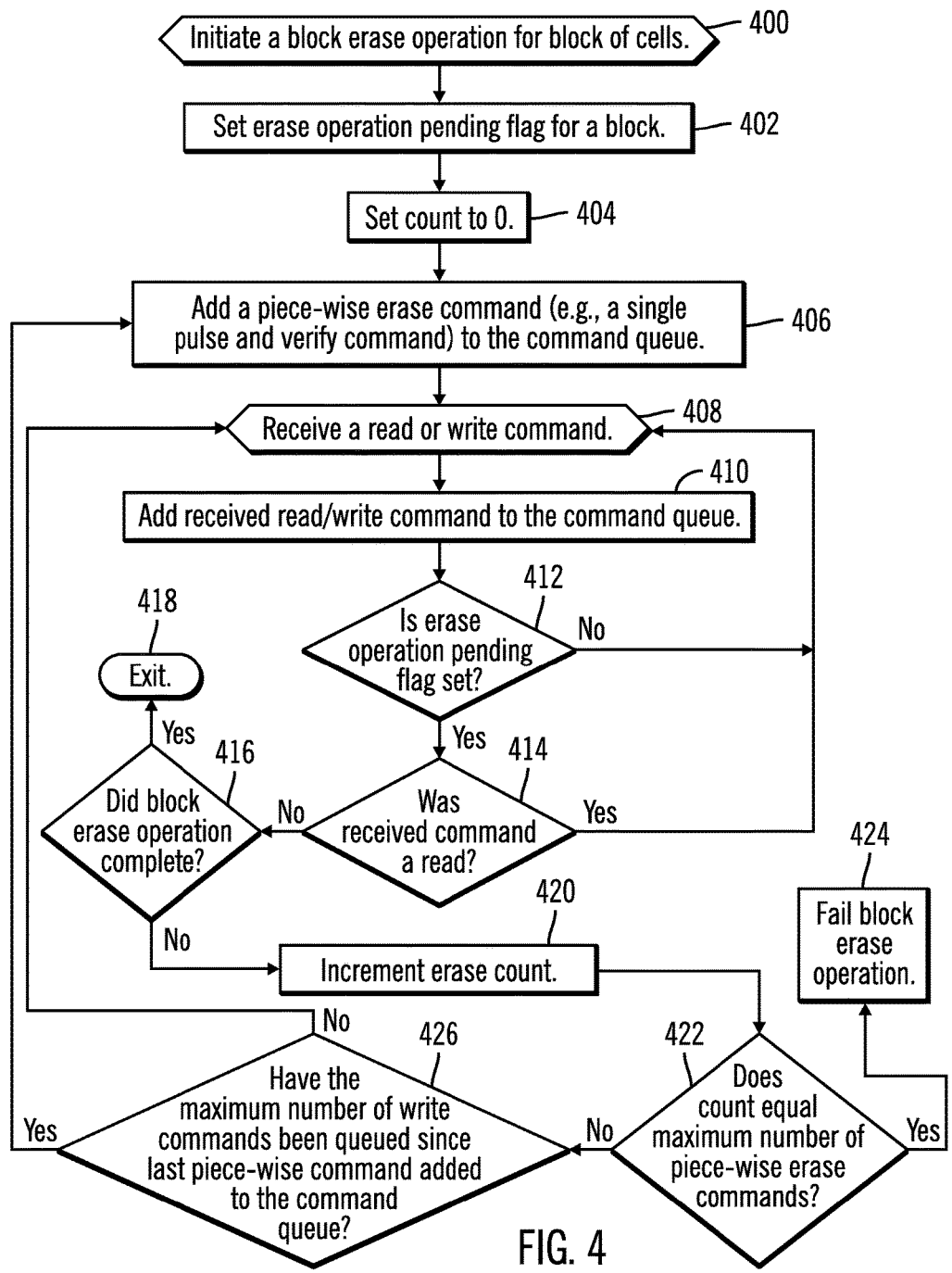
FIG. 4 illustrates an embodiment of operations to interleave erase piece-wise commands with read and write commands in a command queue.

FIG. 4 illustrates an embodiment of operations performed by the I/O logic 106 of the controller 102 to perform the erase operation using the command queue 108 and erase registers 200. Upon initiating (at block 400) the block erase operation for a block of cells 202, the erase operation pending flag 204 is set (at block 402) to indicate that block erase is pending and count 208 is set (at block 404) to zero. The I/O logic 106 adds (at block 406) a piece-wise erase command, e.g., a single pulse and verify command, to the command queue 108. Upon receiving (at block 408) a read or write command, the received read/write command is added (at block 410) to the command queue 108.

If (at block 412) the erase operation pending flag 204 indicates the block erase operation is pending, i.e., has not completed, then if (at block 414) the received command is a write (from the no branch of block 414), a determination is made (at block 416) whether the block erase operation completed, such as if the erase operation pending flag 204 is not set. If so, control exits (at block 418) from the logic of FIG. 4. If the block erase operation did not complete, then the count 208 is incremented (at block 420). If (at block 422) the count 208 is the maximum number of piece-wise erase commands 206 permitted, then the block erase operation is failed (at block 424) because the erase did not complete within a number 206 of piece-wise erase commands. If (at block 422) the maximum number of piece-wise erase commands have not been performed for the pending erase operation, then a determination is made (at block 426) whether a maximum number of write commands have been queued since a last piece-wise erase command was added to the command queue 108. If the maximum number of writes have been queued, control proceeds back to block 406 to add another piece-wise erase command to the queue, so as to ensure the erase operation will complete before an entire block of write operations have been performed, so that a block is always assured to be erased at the time a block is written.

If (from the no branch of block 412) the erase operating pending flag 204 indicates a block erase operation is not pending or if (from the yes branch of block 414) a read command was received or if (from the no branch of block 422) the maximum number of writes have not been queued, then control proceeds back to block 408 to await the next read/write command to queue.

The described operations of FIG. 4 interleave piece-wise erase commands between groups of read and/or write commands, such that a piece-wise erase command is added to the queue after a maximum number of writes have been added. In alternative embodiments, other techniques may be used to determine when to interleave the piece-wise erase command, such as after a fixed number of both reads and writes, etc.

Figure 5:
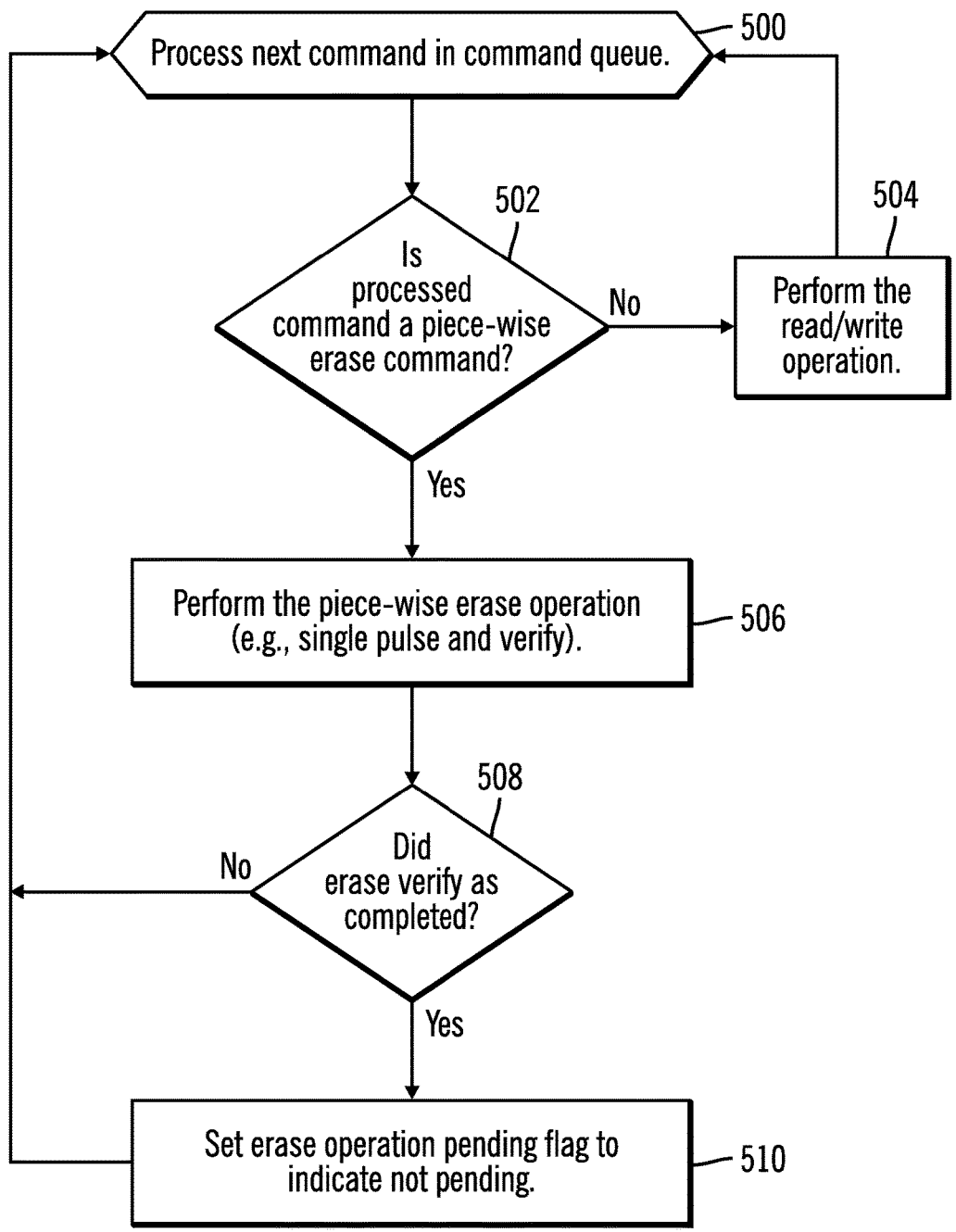
FIG. 5 illustrates an embodiment of operations to process commands in the command queue.

FIG. 5 illustrates an embodiment of operations performed by the I/O logic 106 to process commands in the command queue 108. Upon processing (at block 500) the next command in the command queue 108, if (at block 502) the processed command is not a piece-wise erase command, then the I/O logic performs (at block 504) the read/write operation of the processed next command. If (at block 502) the processed command is a piece-wise erase command, then the piece-wise erase operation is performed (at block 506), e.g., a single pulse and verify operation. If (at block 508) the block erase operation is verified as completed, then the erase operation pending flag 204 is set (at block 510) to indicate the erase is not pending and control proceeds back to block 500 to process the next command in the queue. If (at block 508) the erase is not verified as completed, then control proceeds to block 500 to process the next command in the queue.

With the operations of FIG. 5, the piece-wise erase commands are processed in the interleaved order in which they are added to the command queue 108.

Figure 6:
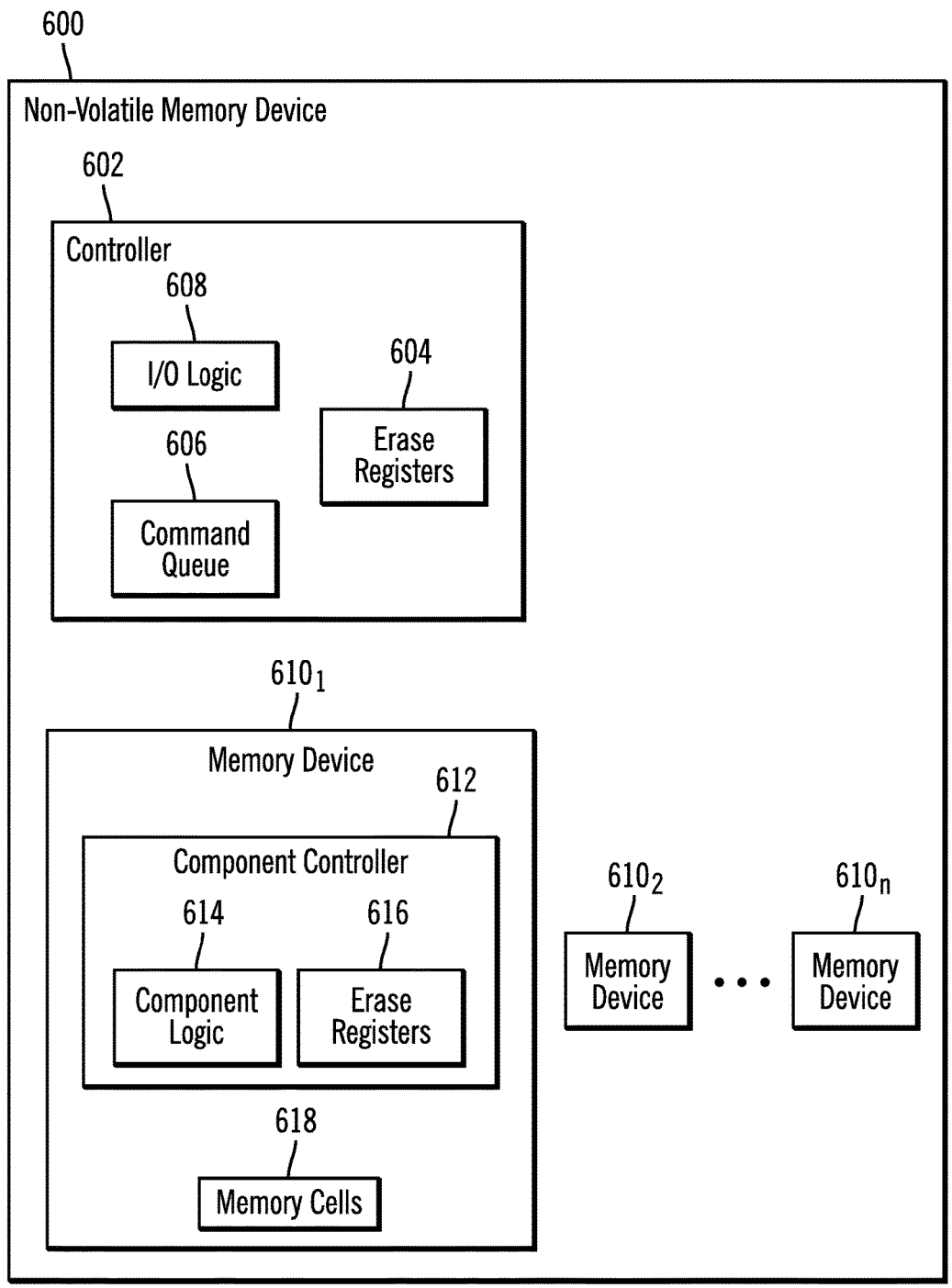
FIG. 6 illustrates an additional embodiment of a non-volatile memory device.
Figure 7:
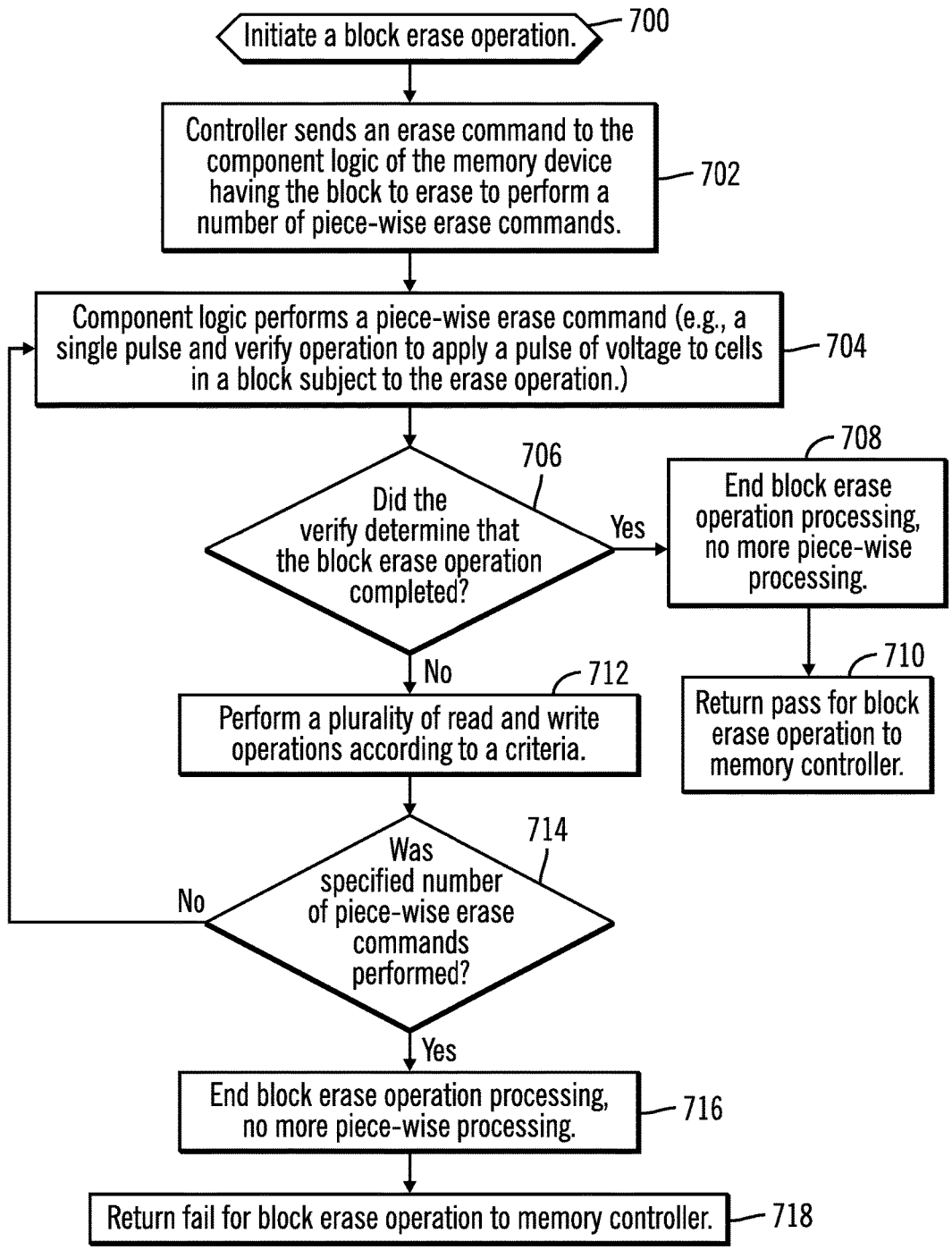
FIG. 7 illustrates an embodiment of operations to interleave erase piece-wise commands with read and write commands using the non-volatile memory device of FIG. 6.

In the operations of FIGS. 1-5, the memory controller 102 performs most of the command processing and management. FIGS. 6 and 7 illustrate an embodiment where the memory devices, e.g., NAND dies, that make up the memory array 104 of FIG. 1 include logic to independently perform and manage the piece-wise erase commands.

FIG. 6 illustrates an embodiment of a non-volatile memory device 600 that includes a controller 602 having I/O logic 608 that buffers read and write commands in a command queue 606, and includes erase registers 604, which may include some or all of the erase registers described with respect to FIG. 2. Memory devices $610_1$, $610_2$ ... $610_n$ include the physical packages, e.g., dies, having the memory cells to which data is written, and may comprise separate integrated circuit dies, such as NAND dies. Memory device $610_1$ shows the components that may be integrated in the memory devices $610_2$ ... $610_n$. Each memory device $610_2$ ... $610_n$ may include a component controller 612 which has component logic 614 to manage I/O operations and erase commands sent from the controller 602 and erase registers 616, which may include some or all of the registers described with respect to FIG. 2 to manage erase operations. Each memory device $610_2$ ... $610_n$ further includes memory cells 618, which may be organized as pages within blocks, such as NAND memory cells.

FIG. 7 illustrates an embodiment of operations performed by the controller I/O logic 608 and the component logic 614 to perform a block erase operation as interleaved piece-wise erase commands (also referred to as commands). Upon initiating (at block 700) a block erase operation for a block in one of the memory devices $610_1$, $610_2$ ... $610_n$, the controller I/O logic 608 sends (at block 702) an erase command to the component logic of the memory device $610_1$, $610_2$ ... $610_n$ having the block to erase to perform a number of piece-wise erase commands. The erase command from the controller 602 may indicate a number of piece-wise erase commands to perform. The component logic 614 performs a piece-wise erase command (e.g., a single pulse and verify operation to apply a pulse of voltage to cells in a block subject to the erase operation.). If (at block 706) the component logic 614 verifies that the performed piece-wise erase command completed the block erase operation to the block of memory cells 618, then the erase operation processing is ended (at block 708), which means no further piece-wise erase commands are performed and a pass of the block erase operation is returned (at block 710) to the memory controller 602.

If (at block 706) the verify determined that the block erase operation did not complete, then the component logic 614 performs (at block 712) a plurality of read and write operations according to a criteria, such as a predetermined number of writes is performed so that the block is erased before an entire block is written, such as described above. If (at block 714) the specified number of piece-wise erase commands was performed, then the block erase operation processing is ended (at block 716) and fail is returned (at block 718) to the controller 602 because the block erase did not complete within the predetermined number of piece-wise erase commands specified by the I/O logic 608. If (at block 714) the specified number of piece-wise erase commands was not performed, control proceeds back to block 704 et seq. to perform another piece-wise erase command.

With the described operations of FIG. 7, a piece-wise erase command is interleaved between performing series of read and write operations. However, with the operations of FIG. 7, the interleaving of the piece-wise erase commands is handled by component logic 614 in the memory device $610_1$, $610_2$ ... $610_n$ having the block in the memory cells 618 to erase. While performing piece-wise erase commands directed toward one block in the cells 618 in the memory device, e.g., $610_1$, the component logic 614 may interleave groups of read and write operations to blocks different from the block subject to the erase operation in the memory cells 618. The embodiment of FIG. 7 may be utilized when the memory devices $610_1$, $610_2$ ... $610_n$ have sufficient component logic 614 to manage the interleaving of the piece-wise erase commands. In certain embodiments, the component controller 612 may maintain a queue to queue read and write commands directed to the memory cells 618.

Figure 8:
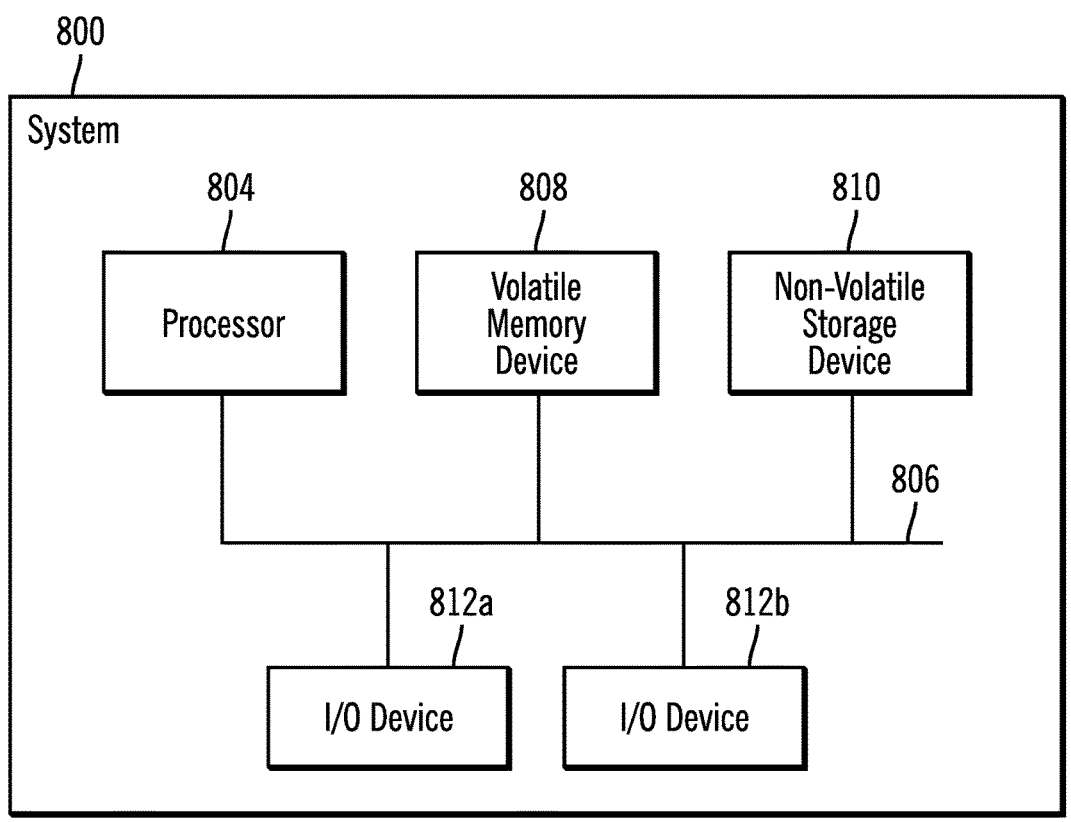
FIG. 8 illustrates a system in which the memory devices of FIGS. 1 and/or 6 may be deployed.

FIG. 8 illustrates an embodiment of a system 800 in which the non-volatile memory device 100 and 600 may be deployed as the volatile memory device 808 and/or a non-volatile memory device 810. The system includes a processor 804 that communicates over a bus 806 with a volatile memory device 808 in which programs, operands and parameters being executed are cached, and a non-volatile storage device 810. The processor 804 may also communicate with Input/Output (I/O) devices 812*a*, 812*b*, which may comprise input devices (e.g., keyboard, touchscreen, mouse, etc.), display devices, graphics cards, ports, network interfaces, etc. The non-volatile storage device 810 may be inserted in a memory slot on the system 800 motherboard, mounted on the system 800 mother board, in an external memory device or accessible over a network.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

EXAMPLES

The following examples pertain to further embodiments.

Example 1 is an apparatus comprising: a non-volatile memory; and memory control logic that when executed performs operations, the operations comprising: generating a command to perform a portion of a block erase operation; performing at least one read or write operation after executing the piece-wise erase command; and generating an additional instance of the piece-wise erase command in response to determining that the block erase operation did not complete after performing the at least one read or write operation.

In Example 2, the subject matter of Examples 1 and 3-10 can optionally include that the generating of the command and the performing the at least one read or write operation comprises interleaving at least one read or write operation with the commands until the block erase operation completes.

In Example 3, the subject matter of Examples 1, 2 and 4-10 can optionally include that the interleaving comprises generating the command between a plurality of read and write operations.

In Example 4, the subject matter of Examples 1-3 and 5-10 can optionally include that the interleaving comprises generating the command after performing a predetermined number of write operations.

In Example 5, the subject matter of Examples 1-4 and 6-10 can optionally include that the block erase operation is performed with respect to a block of pages and one write operation is performed with respect to a page, wherein the interleaving comprises limiting the number of write operations before executing the command so that the block is successfully erased by a time a block of pages is written.

In Example 6, the subject matter of Examples 1-5 and 7-10 can optionally include that the interleaving comprises continuing to perform read operations without performing generating the command, wherein only the performance of a number of write operations and not read operations causes the command to be generated.

In Example 7, the subject matter of Examples 1-6 and 8-10 can optionally include that the command is executed to perform one pulse and verify operation to apply a pulse of voltage to cells subject to the erase operation and the verify verifies whether the cells subject to the block erase operation are in an erased state.

In Example 8, the subject matter of Examples 1-7 and 9-10 can optionally include that the non-volatile memory is implemented in a plurality of memory dies, and the memory control logic is located external to the memory chips in a memory device including the memory chips and the memory control logic.

In Example 9, the subject matter of Examples 1-8 and 10 can optionally include that the non-volatile memory is implemented in a plurality of memory dies, and the memory control logic comprises a controller external to the memory dies and component logic implemented on each of the memory dies, wherein the component logic on the memory die having the cells to erase executes the commands, wherein the performing the at least one read and operation and the determining whether the erase operation completed are performed by the component logic.

In Example 10, the subject matter of Examples 1-9 can optionally include that the operations further comprise: communicating, by the controller, a number of commands to perform to the component logic; performing, by the component logic, a number of commands in response to the number communicated by the controller; returning, by the component logic, fail for the erase operation to the controller in response to the block erase operation not completing after performing the communicated number of commands; and returning, by the component logic, pass for the block erase operation to the controller in response to the block erase operation completing after performing the communicated number of commands.

Example 11 is a memory controller coupled to a non-volatile memory, comprising: memory control logic that when executed performs operations, the operations comprising: generating a command to perform a portion of a block erase operation; performing at least one read or write operation after executing the piece-wise erase command; and executing an additional instance of the command in response to determining that the block erase operation did not complete after performing the at least one read or write operation.

In Example 12, the subject matter of Examples 11 and 13-16 can optionally include that the generating the erase command and the at least one read or write operation comprises interleaving at least one read or write operation with the commands until the erase operation completes.

In Example 13, the subject matter of Examples 11, 12 and 14-16 can optionally include that the interleaving comprises performing one command between a plurality of read and write operations.

In Example 14, the subject matter of Examples 11-13, 15, and 16 can optionally include that the command is executed to perform one pulse and verify operation to apply a pulse of voltage to cells subject to the block erase operation and the verify verifies whether the cells subject to the block erase operation are in an erased state.

In Example 15, the subject matter of Examples 11-14 and 16 can optionally include that the non-volatile memory is implemented in a plurality of memory dies, and the memory control logic is located external to the memory chips in a memory device including the memory chips and the memory control logic.

In Example 16, the subject matter of Examples 11-15 can optionally include that the non-volatile memory is implemented in a plurality of memory dies, and wherein the memory control logic comprises a controller external to the memory dies and component logic implemented on each of the memory dies, wherein the component logic on the memory die having the cells to erase executes the commands, wherein the performing the at least one read and operation and the determining whether the block erase operation completed are performed by the component logic.

Example 17 is a method for performing a block erase operation with respect to a non-volatile memory, comprising: generating a command to perform a portion of a block erase operation; performing at least one read or write operation after executing the piece-wise erase command; and generating an additional instance of the command in response to determining that the block erase operation did not complete after performing the at least one read or write operation.

In Example 18, the subject matter of Examples 17 and 19-22 can optionally include that the generating the command and the at least one read or write operation comprises interleaving at least one read or write operation with piece-wise erase commands until the erase operation completes.

In Example 19, the subject matter of Examples 17, 18 and 20-22 can optionally include that the interleaving comprises generating one command between a plurality of read and write operations.

In Example 20, the subject matter of Examples 17-19, 21, and 22 can optionally include that the command is executed to perform one pulse and verify operation to apply a pulse of voltage to cells subject to the block erase operation and the verify verifies whether the cells subject to the block erase operation are in an erased state.

In Example 21, the subject matter of Examples 17-20 and 22 can optionally include that the non-volatile memory is implemented in a plurality of memory dies, and wherein the operations of generating the commands, determining whether the erase operation completed, and executing the additional instance of the piece-wise erase command are performed by memory control logic located external to the memory chips in a memory device including the memory chips and the memory control logic.

In Example 22, the subject matter of Examples 17-21 can optionally include that the non-volatile memory is implemented in a plurality of memory dies, wherein a controller external to the memory dies generates the commands, wherein component logic on the memory die having the cells to erase executes the commands, and wherein the performing the at least one read and operation and the determining whether the erase operation completed are performed by the component logic.

In Example 23, the subject matter of Example 17 can further comprise at least one step of:

(1) wherein the generating the command and the at least one read or write operation comprises interleaving at least one read or write operation with the commands until the erase operation completes; and/or (2) wherein the interleaving comprises performing one command between a plurality of read and write operations; and/or (3) wherein the interleaving comprises performing the command after performing a predetermined number of write operations; and/or (4) wherein the erase operation is performed with respect to a block of pages and one write operation is performed with respect to a page, wherein the interleaving comprises limiting the number of write operations before a command so that the block is successfully erased by a time a block of pages is written; and/or (5) wherein the interleaving comprises continuing to perform read operations without performing the command, wherein only the performance of a number of write operations and not read operations causes the command to be generated; and/or.

(6) wherein the command is executed to perform one pulse and verify operation to apply a pulse of voltage to cells subject to the block erase operation and the verify verifies whether the cells subject to the erase operation are in an erased state; and/or (7) wherein the non-volatile memory cells are implemented in a plurality of memory dies, and wherein the memory control logic is located external to the memory chips in a memory device including the memory chips and the memory control logic; and/or (8) wherein the non-volatile memory cells are implemented in a plurality of memory dies, and wherein the memory control logic comprises a controller external to the memory dies and component logic implemented on each of the memory dies, wherein the controller sends a command to the component logic on the memory die having the cells to erase to perform the piece-wise erase commands, the at least one read and operation, and the determining whether the erase operation completed; and/or (9) wherein the operations further comprise: communicating, by the controller, a number of piece-wise erase commands to perform to the component logic; performing, by the component logic, a number of commands in response to the number communicated by the controller; returning, by the component logic, fail for the block erase operation to the controller in response to the block erase operation not completing after performing the communicated number of commands; and returning, by the component logic, pass for the block erase operation to the controller in response to the block erase operation completing after performing the communicated number of piece-wise erase commands.

Example 24 is a system, comprising: a processor executing program code that generates read and write operations; a storage device, comprising: a non-volatile memory; and memory control logic that when executed performs operations, the operations comprising: generating a command to perform a portion of a block erase operation; performing at least one read or write operation from the processor executing the program code after executing the command; determining whether the block erase operation completed as a result of executing the command; and executing an additional instance of the command in response to determining that the block erase operation did not complete after performing the at least one read or write operation.

In Example 25, the subject matter of Example 24 can optionally include that the performing of the command and the at least one read or write operation from the processor comprises interleaving at least one read or write operation with the commands until the block erase operation completes.

In Example 26, the subject matter of Examples 24 and 25 can optionally include that the command is executed to perform one pulse and verify operation to apply a pulse of voltage to cells subject to the block erase operation and the verify verifies whether the cells subject to the block erase operation are in an erased state.

Example 27 is a system, comprising: a processor executing program code that generates read and write operations; a storage device, comprising: a non-volatile memory; and means for generating a command to perform a portion of a block erase operation; means for performing at least one read or write operation from the processor executing the program code after executing the piece-wise erase command; and means for executing an additional instance of the command in response to determining that the block erase operation did not complete after performing the at least one read or write operation.

Example 28 is an apparatus, comprising: means for generating a command to perform a portion of a block erase operation with respect to a non-volatile memory; means for performing at least one read or write operation after executing the command; and means for executing an additional instance of the command in response to determining that the block erase operation did not complete after performing the at least one read or write operation.

Example 29 is an apparatus comprising means to perform a method as claimed in any preceding claim.

Example 30 is a machine-readable storage including machine-readable instructions, when executed, to implement a method or realize an apparatus or system as claimed in any preceding claim.

What is claimed:

1. An apparatus, comprising:
 a non-volatile memory; and
 memory control logic to:
  generate a command to perform a portion of a block erase operation with respect to a block, wherein the block comprises a block of pages in the non-volatile memory;
  perform at least one read or write operation with respect to a page after executing the command; and
  generate an additional instance of the command to perform an additional portion of the block erase operation with respect to the block in response to determining that the block erase operation of the block did not complete after performing the at least one read or write operation, wherein each of multiple instances of the command are interleaved with read or write operations by generating each of the instances of the command between a plurality of read or write operations until the block erase operation completes, wherein interleaving the instances of the command limits a number of the write operations before executing the command so that the block is successfully erased by a time a block of pages is written.

2. The apparatus of claim 1, wherein the interleaving the instances of the command generates each of the instances of the command after performing a predetermined number of write operations.

3. The apparatus of claim 1, wherein the interleaving instances of the command continues to perform read operations without generating an instance of the command, wherein only to perform a number of write operations and not read operations causes the instance of the command to be generated.

4. The apparatus of claim 1, wherein the command is executed to perform a pulse and verify operation to apply a pulse of voltage to cells of the block subject to the block erase operation and to verify whether the cells subject to the block erase operation are in an erased state.

5. The apparatus of claim 1, wherein the non-volatile memory is implemented in a plurality of memory devices having memory cells, and wherein the memory control logic is located external to the memory devices in the apparatus including the memory devices and the memory control logic.

6. The apparatus of claim 1, wherein the non-volatile memory is implemented in a plurality of memory devices including memory cells, and wherein the memory control logic comprises a controller external to the memory devices and component logic implemented on each of the memory devices, wherein the component logic on the memory devices having the memory cells executes the instances of the command, wherein to perform the at least one read or write operation and to determine the block erase operation did not complete are performed by the component logic.

7. An apparatus, comprising:
 a non-volatile memory implemented in a plurality of memory devices including memory cells; and
 a memory control logic comprising a controller external to the memory devices and a component logic implemented on each of the memory devices to:
  generate, by the controller, a command, executed by the component logic, to perform a portion of a block erase operation with respect to a block in the non-volatile memory;
  communicate, by the controller, a number of instances of the command to perform the block erase operation to the component logic;
  perform, by the component logic, the number of the instances of the command in response to the number of the instances of the command communicated by the controller;
  perform, by the component logic, at least one read or write operation after executing each of the number of the instances of the command; and
  return, by the component logic, a fail for the block erase operation to the controller in response to the block erase operation not completing after performing the number of the instances of the command; and
  returning, by the component logic, a pass for the block erase operation to the controller in response to the block erase operation completing after performing the number of the instances of the command.

8. A memory controller coupled to a non-volatile memory, comprising:
 a memory control logic that when executed performs operations, the operations comprising:
  generate a command to perform a portion of a block erase operation with respect to a block, wherein the block comprises a block of pages in the non-volatile memory;
  perform at least one read or write operation with respect to a page after executing the command; and
  generate an additional instance of the command to perform an additional portion of the block erase operation with respect to the block in response to determining that the block erase operation of the block did not complete after performing the at least one read or write operation, wherein each of multiple instances of the command are interleaved with read or write operations by generating each of the instances of the command between a plurality of read or write operations until the block erase operation completes, wherein interleaving the instances of the command limits a number of the write operations before executing the command so that the block is successfully erased by a time a block of pages is written.

9. The memory controller of claim 8, wherein to generate the command and to perform the at least one read or write operation comprises interleaving at least one read or write operation with the instances of the command until the block erase operation of the block completes.

10. The memory controller of claim 9, wherein the interleaving the command generates each of the instances of the command between a plurality of read and write operations.

11. The memory controller of claim 8, wherein the command is executed to perform a pulse and verify operation to apply a pulse of voltage to cells in the block subject to the portion of the block erase operation and to verify whether the cells subject to the block erase operation are in an erased state.

12. The memory controller of claim 8, wherein the non-volatile memory is implemented in a plurality of memory devices having memory cells, and wherein the memory control logic is located external to the memory devices in a non-volatile memory device including the memory devices and the memory control logic.

13. The memory controller of claim 8, wherein the non-volatile memory is implemented in a plurality of memory devices including memory cells, and wherein the memory control logic comprises a controller external to the memory devices and component logic implemented on each of the memory devices, wherein the component logic on the memory devices having the memory cells to erase executes the instances of the command, wherein to perform the at least one read or write operation and to determine that the block erase operation did not complete are performed by the component logic.

14. A method for performing a block erase operation with respect to a non-volatile memory, comprising:
generating a command to perform a portion of a block erase operation with respect to a block a block, wherein the block comprises a block of pages in the non-volatile memory;
performing at least one read or write operation with respect to a page after executing the command; and
generating an additional instance of the command to perform an additional portion of the block erase operation with respect to the block in response to determining that the block erase operation of the block did not complete after performing the at least one read or write operation, wherein each of multiple instances of the command are interleaved with read or write operations by generating each of the instances of the command between a plurality of read or write operations until the block erase operation completes, wherein interleaving the instances of the command limits a number of the write operations before executing the command so that the block is successfully erased by a time a block of pages is written.

15. The method of claim 14, wherein the command is executed to perform a pulse and verify operation to apply a pulse of voltage to cells subject to the portion of the block erase operation and to verify whether the cells subject to the block erase operation are in an erased state.

16. The method of claim 14, wherein the non-volatile memory is implemented in a plurality of memory devices having memory cells, and wherein the operations of generating the instances of the command, determining whether the block erase operation completed, and executing the additional instance of the command are performed by memory control logic located external to the memory devices in a non-volatile memory device including the memory devices and the memory control logic.

17. The method of claim 14, wherein the non-volatile memory is implemented in a plurality of memory devices including memory cells, wherein a controller external to the memory devices generates the instances of the command, wherein component logic on the memory devices having the memory cells to erase executes the instances of the command, and wherein to perform the at least one read or write operation and to determine whether the block erase operation completed are performed by the component logic.

18. A system, comprising:
a processor executing program code that generates read and write operations;
a storage device, comprising:
a non-volatile memory; and
memory control logic to:
generate a command to perform a portion of a block erase operation with respect to a block a block, wherein the block comprises a block of pages in the non-volatile memory for a block erase operation for the block;
perform at least one read or write operation with respect to a page from the processor executing the program code after executing the command; and
execute an additional instance of the command to perform an additional portion of the block erase operation with respect to the block in response to determining that the block erase operation of the block did not complete after performing the at least one read or write operation, wherein each of multiple instances of the command are interleaved with read or write operations by generating each of the instances of the command between a plurality of read or write operations until the block erase operation completes, wherein interleaving the instances of the command limits a number of the write operations before executing the command so that the block is successfully erased by a time a block of pages is written.

19. The system of claim 18, wherein to generate the instances of the command and to perform the at least one read or write operation from the processor comprises interleaving the at least one read or write operation with the instances of the command until the block erase operation for the block completes.

20. The system of claim 18, wherein the command is executed to perform a pulse and verify operation to apply a pulse of voltage to cells subject to the portion of the block erase operation and to verify whether the cells subject to the block erase operation are in an erased state.

* * * * *